United States Patent
Lee et al.

(10) Patent No.: US 11,749,351 B2
(45) Date of Patent: Sep. 5, 2023

(54) MEMORY CONTROLLER AND METHOD OF OPERATING THE MEMORY CONTROLLER

(71) Applicant: SK hynix Inc., Icheon-si (KR)

(72) Inventors: Dong Uk Lee, Icheon-si (KR); Hae Chang Yang, Icheon-si (KR); Hun Wook Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 89 days.

(21) Appl. No.: 17/404,652

(22) Filed: Aug. 17, 2021

(65) Prior Publication Data

US 2022/0293186 A1  Sep. 15, 2022

(30) Foreign Application Priority Data

Mar. 15, 2021 (KR) .................. 10-2021-0033373

(51) Int. Cl.
| | | |
|---|---|---|
| *G11C 16/04* | (2006.01) | |
| *G11C 16/34* | (2006.01) | |
| *G11C 16/10* | (2006.01) | |
| *G11C 16/14* | (2006.01) | |
| *G11C 16/08* | (2006.01) | |
| *G11C 16/30* | (2006.01) | |
| *G11C 16/26* | (2006.01) | |

(52) U.S. Cl.
CPC ........... *G11C 16/102* (2013.01); *G11C 16/08* (2013.01); *G11C 16/14* (2013.01); *G11C 16/26* (2013.01); *G11C 16/30* (2013.01)

(58) Field of Classification Search
CPC ....... G11C 16/102; G11C 16/04; G11C 16/08; G11C 16/14; G11C 16/26; G11C 16/30; G11C 16/0483; G11C 16/34; G11C 16/3481; G11C 16/3486; G11C 16/3459; G11C 16/10

See application file for complete search history.

(56) References Cited

U.S. PATENT DOCUMENTS

| | | |
|---|---|---|
| 8,788,741 B2 | 7/2014 | Kwon et al. |
| 9,583,206 B2 | 2/2017 | Luo et al. |
| 9,704,595 B1 | 7/2017 | Eyal et al. |
| 10,347,329 B2 | 7/2019 | Jean et al. |

(Continued)

FOREIGN PATENT DOCUMENTS

| | | |
|---|---|---|
| KR | 1020180001303 A | 1/2018 |
| KR | 102131324 B1 | 7/2020 |

*Primary Examiner* — Hien N Nguyen
(74) *Attorney, Agent, or Firm* — WILLIAM PARK & ASSOCIATES LTD.

(57) ABSTRACT

A memory controller that controls a memory device including a memory block includes an initial program controller configured to control the memory device to program at least one or more monitoring memory cells from among memory cells respectively connected to monitoring word lines from among a plurality of word lines connected to the memory block, a pre-read controller configured to generate a shifting information of a threshold voltage distribution of the monitoring memory cells based on a result of reading the monitoring memory cells before a read operation is performed on the memory block, and a pre-program controller configured to control the memory device to perform the read operation after applying a pre-program voltage having a voltage level determined according to the shifting information to the plurality of word lines.

20 Claims, 17 Drawing Sheets

(56) References Cited

U.S. PATENT DOCUMENTS

| | | | |
|---|---|---|---|
| 10,964,402 B1* | 3/2021 | Chen | G11C 11/5628 |
| 11,139,018 B1* | 10/2021 | Zainuddin | G11C 7/12 |
| 11,361,835 B1* | 6/2022 | Lien | G11C 16/32 |
| 2019/0115083 A1* | 4/2019 | Lee | G11C 11/5642 |
| 2021/0257039 A1* | 8/2021 | Prakash | G11C 16/0483 |
| 2021/0304830 A1* | 9/2021 | Li | G11C 16/3445 |

* cited by examiner

MEMORY CONTROLLER AND METHOD OF OPERATING THE MEMORY CONTROLLER

CROSS-REFERENCE TO RELATED APPLICATION

The present application claims priority under 35 U.S.C. § 119(a) to Korean patent application number 10-2021-0033373 filed on Mar. 15, 2021, in the Korean Intellectual Property Office, the entire disclosure of which is incorporated by reference herein.

BACKGROUND

1. Technical Field

The present disclosure relates to an electronic device, and more particularly, to a memory controller and a method of operating the memory controller.

2. Related Art

A storage device is a device that stores data under control of a host device such as a computer, a smart phone, or a smart pad. The storage device includes a device that stores data in a magnetic disk such as a hard disk drive (HDD), a device that stores data in a semiconductor memory such as a solid state drive (SSD), or a memory card, in particular, a nonvolatile memory.

The storage device may include a memory device in which data is stored and a memory controller that stores data in the memory device. The memory device may be classified into a volatile memory and a nonvolatile memory. Here, the nonvolatile memory includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like.

SUMMARY

According to an embodiment of the present disclosure, a memory controller that controls a memory device including a memory block may include an initial program controller configured to control the memory device to program at least one or more monitoring memory cells from among memory cells respectively connected to monitoring word lines from among a plurality of word lines connected to the memory block, a pre-read controller configured to generate a shifting information of a threshold voltage distribution of the monitoring memory cells based on a result of reading the monitoring memory cells before a read operation is performed on the memory block, and a pre-program controller configured to control the memory device to perform the read operation after applying a pre-program voltage having a voltage level determined according to the shifting information to the plurality of word lines.

According to an embodiment of the present disclosure, a method of operating a memory controller that controls a memory device including a memory block may include receiving a program request corresponding to the memory block from a host, programming at least one or more monitoring memory cells among memory cells respectively connected to monitoring word lines from among a plurality of word lines connected to the memory block before a program operation corresponding to the program request is performed, receiving a read request corresponding to the memory block from the host, reading the monitoring memory cells before a read operation corresponding to the read request is performed, generating a shifting information of a threshold voltage distribution of the monitoring memory cells based on a result of reading the monitoring memory cells, and determining whether to program memory cells included in the memory block before the read operation based on the shifting information.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a memory controller and a method of operating the memory controller for securing reliability of read data by performing a pre-program operation before performing a read operation.

According to the present technology, after programming the memory cells selected as the monitoring memory cells in a single level cell method, the memory cells may be processed as a read fail through a pre-read operation on the monitoring memory cells before the read operation or the read operation is performed after the pre-program operation. Therefore, reliability of the read operation may be improved.

Figure 1:
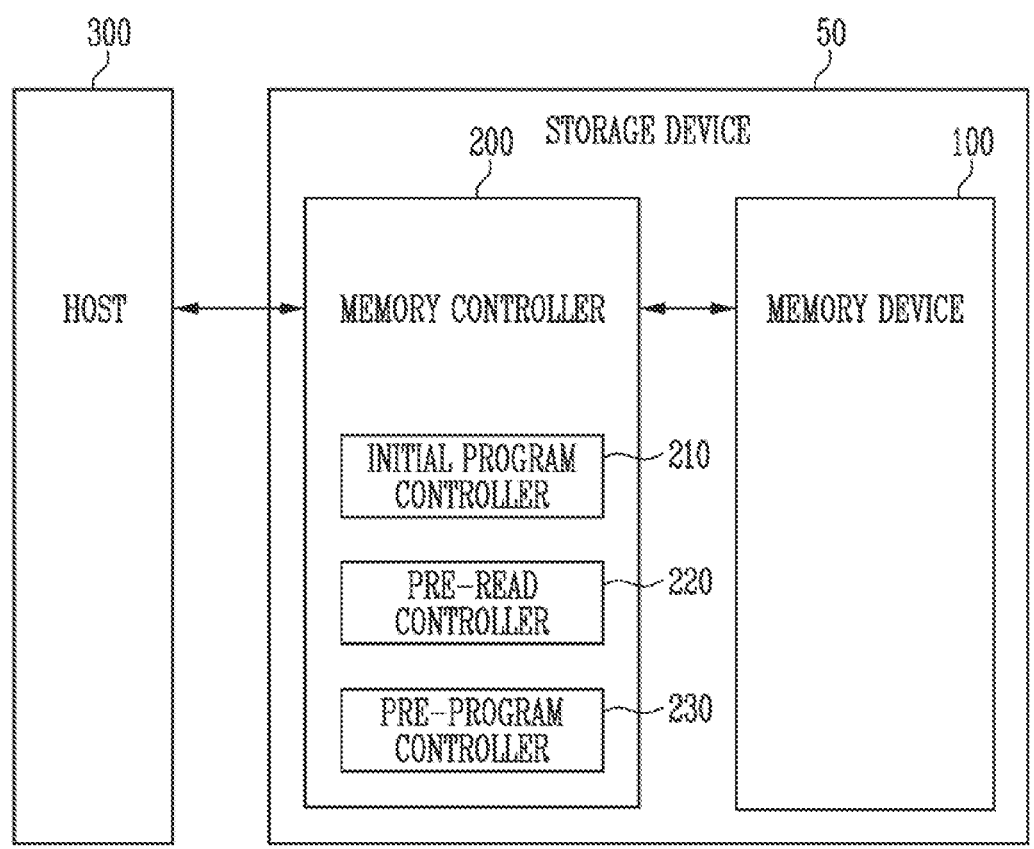
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a single level cell (SLC) method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple level cell (TLC) method of storing three data bits in one memory cell, or a quadruple level cell (QLC) method of storing four data bits in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write operation (program operation), a read operation, or an erase operation according to the received command. For example, when a program command is received, the memory device 100 may program data to the area selected by the address. When a read command is received, the memory device 100 may read data from the area selected by the address. When an erase command is received, the memory device 100 may erase data stored in the area selected by the address.

The memory controller 200 may control an overall operation of the storage device 50.

When a power voltage is applied to the storage device 50, the memory controller 200 may execute firmware. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data included in the memory device 100 is to be stored. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or the like according to the request of the host 300. For example, when a program request is received from the host 300, the memory controller 200 may convert the program request into a program command, and may provide the program command, the PBA, and data to the memory device 100. When a read request is received from the host 300 together with the LBA, the memory controller 200 may change the read request into a read command, select a PBA corresponding to the LBA, and then provide the read command and the PBA to the memory device 100. When an erase request is received from the host 300 together with the LBA, the memory controller 200 may change the erase request into an erase command, select a PBA corresponding to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide the command, the address, and the data to the memory device 100 to perform background operations such as a program operation for wear leveling and a program operation for garbage collection.

In an embodiment, after data is programmed in the memory device 100, IR-reflow may be performed on a wafer. The IR-reflow may refer to a semiconductor packaging process performed through an infrared heat treatment device. Since the IR-reflow is performed at a high temperature or preset temperature, a transferal of a charge of the memory cells may increase in a high temperature or preset temperature state.

As the transferal of the charge increases, the data programmed in the memory device 100 may change. That is, as the IR-reflow is performed, a threshold voltage distribution of the memory cells included in the memory device 100 may be shifted.

Therefore, in the present disclosure, in order to secure reliability of data, it may be checked in advance that the memory device 100 is exposed to the high temperature or preset temperature. In addition, in the present disclosure, a method, in which the read operation is processed as a fail before the read operation is performed on the memory device 100 or the read operation is performed after selectively performing a pre-program operation, is presented.

In an embodiment, the memory controller 200 may include an initial program controller 210. Before the program operation is performed on each of the plurality of memory blocks included in the memory device 100, the initial program controller 210 may program memory cells connected to specific word lines among word lines connected to a specific string of a corresponding memory block. At this time, the memory cells may be programmed in a single level cell (SLC) method.

For example, before a program operation is performed on a memory block, the initial program controller 210 may select a string of an edge from among a plurality of strings connected to the corresponding memory block as the sense string. When the sense string is selected, the initial program controller 210 may select a start word line and a last word line from among a plurality of word lines connected to the sense string as monitoring word lines. The monitoring word lines may be most adjacent to a select line connected to the memory block. The monitoring memory cells may be included in a string has closest physical distance from the row decoder among a plurality of strings included in the memory block.

The initial program controller 210 may control the memory device 100 to program at least one memory cell among memory cells connected to the selected monitoring word lines in the SLC method. At this time, program data or dummy data may be programmed in at least one or more memory cells. For example, program data may be a data to be programmed in at least one or more memory cells according to a program request received from the host. Dummy data may be randomly generated data regardless of the program request.

In an embodiment, the memory controller 200 may include a pre-read controller 220. The pre-read controller 220 may control the memory device 100 to perform a pre-read operation before the read operation is performed on the memory device 100. The pre-read operation may be a read operation performed with pre-read voltages that are read voltages higher than a normal read voltage. Through the pre-read operation, it may be checked in advance that the memory device 100 is exposed at the high temperature or preset temperature.

For example, the pre-read controller 220 may control the memory device 100 to perform the pre-read operation on the memory cells of the start word line and the last word line connected to the sense string of the memory block on which the read operation is to be performed.

The pre-read controller 220 may determine shifting of the threshold voltage distribution of the memory cells based on data read with the pre-read voltages. When a shifting degree of the threshold voltage distribution is large, the pre-read controller 220 may determine that the memory device 100 is exposed for a long time or preset time in the high temperature or preset temperature, and process the read operation as a failure before the read operation is performed.

In an embodiment, the memory controller 200 may include a pre-program controller 230. The pre-program controller 230 may control the memory device 100 to perform the pre-program operation based on the shifting of the threshold voltage distribution of the memory cells determined by the pre-read controller 220. The pre-program operation may be an operation of applying the program voltage to word lines connected to a memory block on which the read operation is to be performed.

For example, when the shifting degree of the threshold voltage distribution is small, the pre-program controller 230 may control the memory device 100 to immediately perform the read operation without the pre-program operation, that is, omitting the pre-program operation. However, when the shifting degree of the threshold voltage distribution reaches a reference value, the preprogram controller 230 may control the memory device 100 to perform the read operation after the pre-program operation is performed.

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or Rambus dynamic random access memory (DRAM), or a static random access memory (SRAM).

In various embodiments, the buffer memory may be connected from an outside of the storage device 50. In this case, the volatile memory devices connected to the outside of the storage device 50 may serve as the buffer memory.

In an embodiment, the memory controller 200 may control at least two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
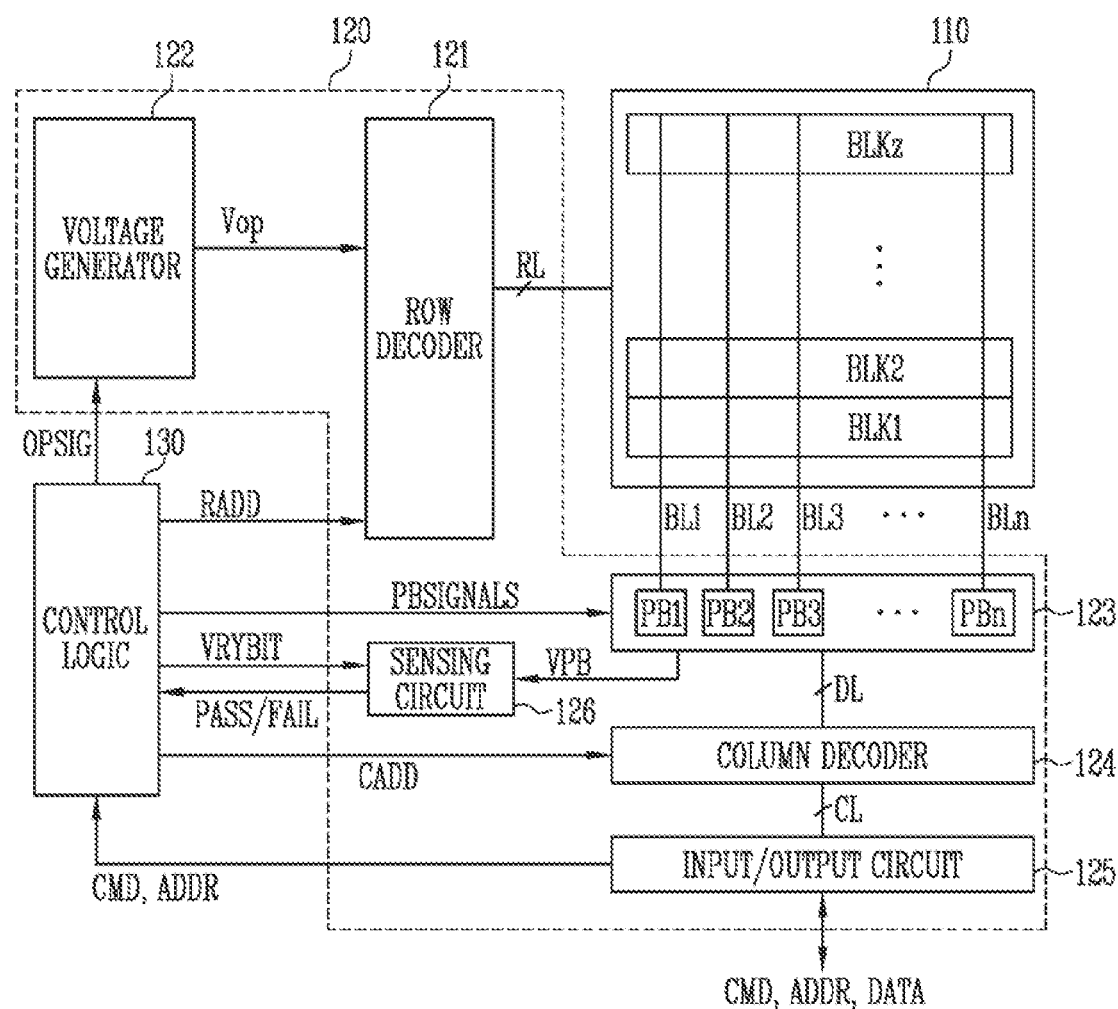
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single level cell (SLC) that stores one data bit, a multi-level cell (MLC) that stores two data bits, a triple level cell (TLC) that stores three data bits, or a quadruple level cell (QLC) that stores four data bits.

The peripheral circuit 120 may be configured to perform the program operation, the read operation, or the erase operation on a selected area of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to an operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when the program voltage is applied to the selected word line, the first to n-th page buffers PB1 to PBn may transfer data DATA received through the input/output circuit 125 to the selected memory cells through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 of FIG. 1 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation is passed or failed in response to the pass signal PASS or the fail signal FAIL.

Figure 3:
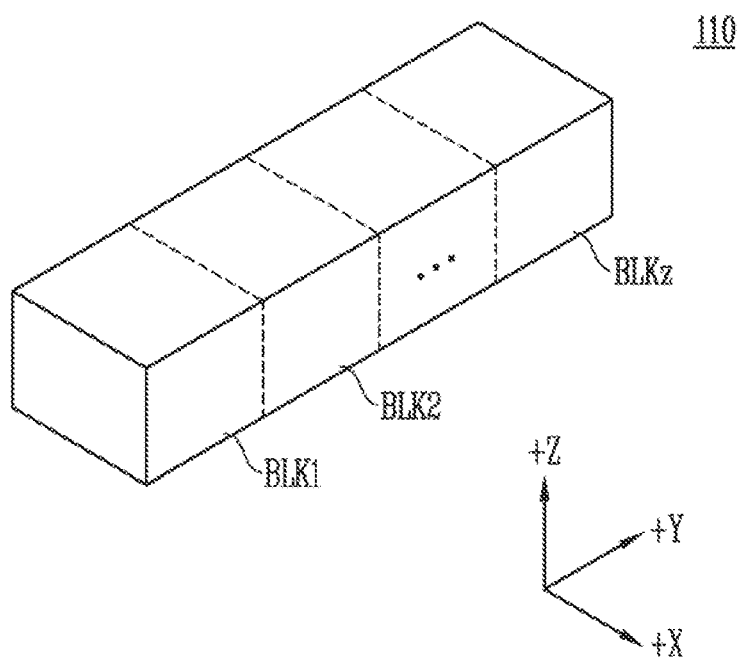
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described below with reference to FIGS. 4 and 5.

Figure 4:
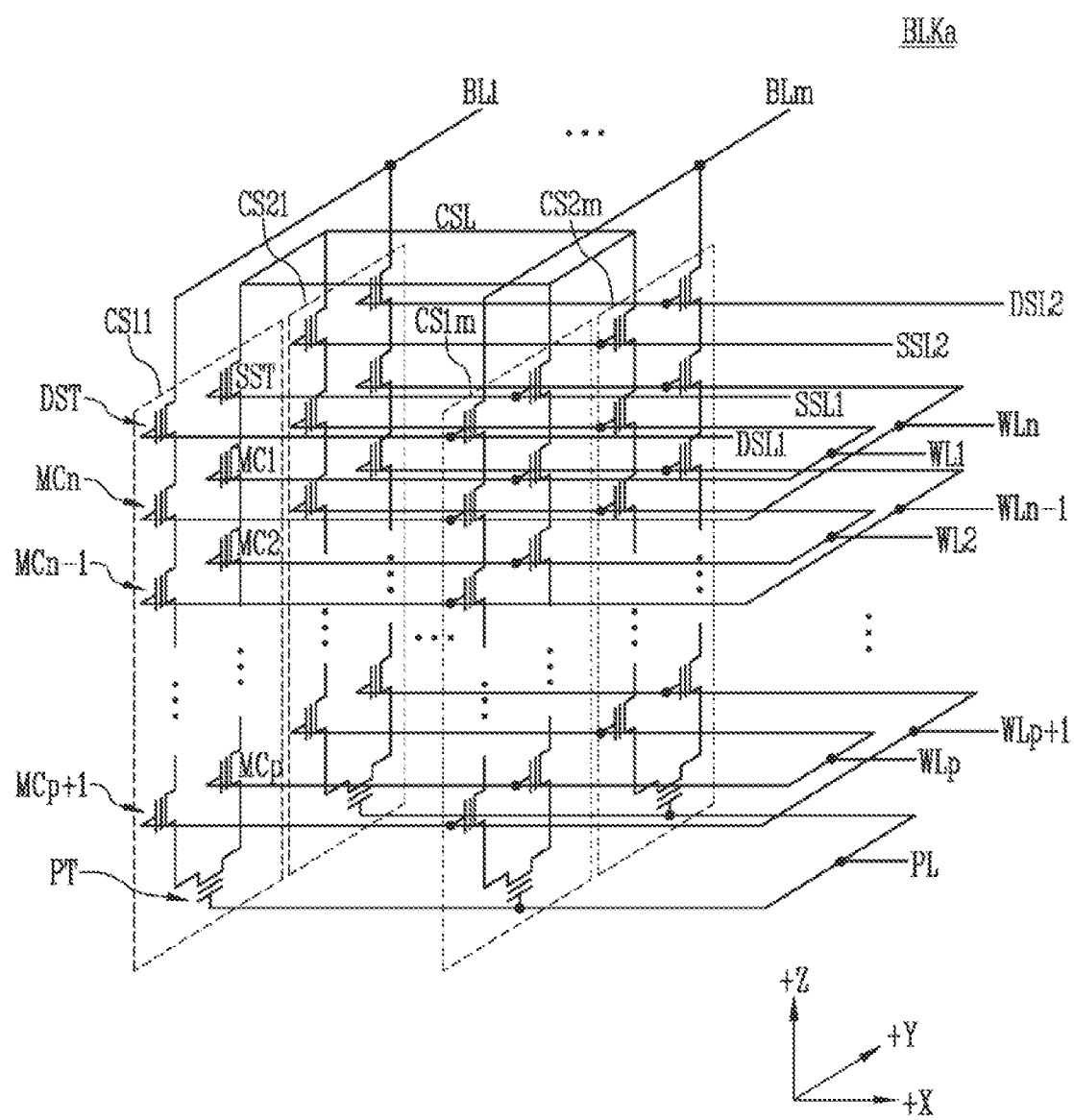
FIG. 4 is a circuit diagram illustrating any one memory block BLKa among memory blocks BLK1 to BLKz of FIG. 3.

FIG. 4 is a circuit diagram illustrating any one memory block BLKa among the memory blocks BLK1 to BLKz of FIG. 3.

Referring to FIG. 4, the memory block BLKa includes a plurality of cell strings CS11 to CS1$m$ and CS21 to CS2$m$. As an embodiment, each of the plurality of cell strings CS11 to CS1$m$ and CS21 to CS2$m$ may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1$m$ and CS21 to CS2$m$ includes at least one source select transistor SST, first to n-th memory cells MC1 to MCn, a pipe transistor PT, and at least one drain select transistor DST.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1$m$ of a first row are connected to a first source select line SSL1. The source select transistors of the cell strings CS21 to CS2$m$ of a second row are connected to a second source select line SSL2.

As another embodiment, the source select transistors of the cell strings CS11 to CS1$m$ and CS21 to CS2$m$ may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1$m$ of the first row are connected to a first drain select line DSL1. The drain select transistors of the cell strings CS21 to CS2$m$ of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1$m$ and CS2$m$ of the m-th column are connected to the m-th bit line BLm.

The memory cells connected to the same word line in the cell strings arranged in the row direction configure one page. For example, the memory cells connected to the first word line WL1, among the cell strings CS11 to CS1$m$ of the first row configure one page. The memory cells connected to the first word line WL1, among the cell strings CS21 to CS2$m$ of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1m or CS21 to SC2m arranged in the row direction may be connected to the even bit lines, and odd-numbered cell strings among the cell strings CS11 to CS1m or CS21 to CS2m arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
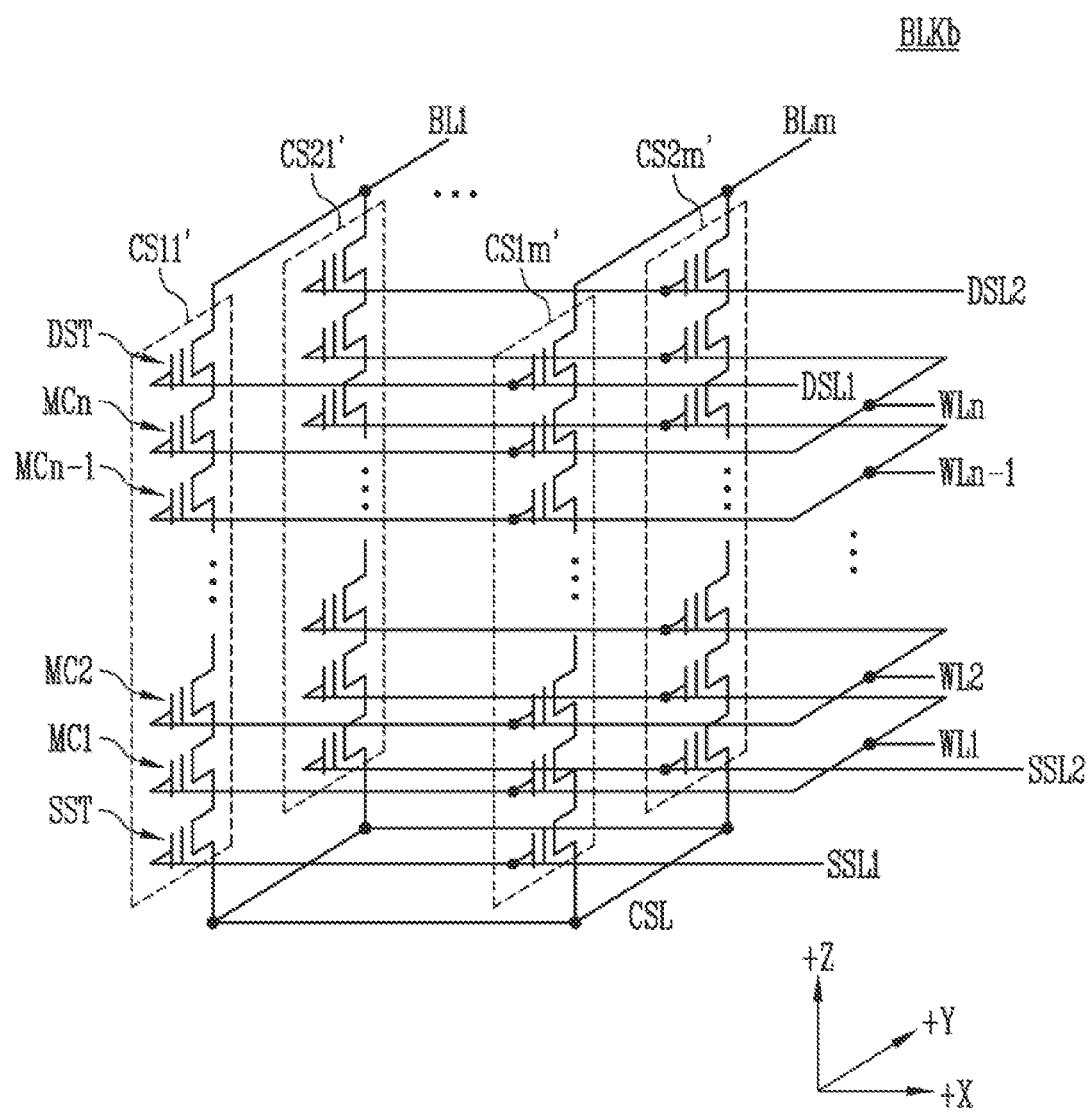
FIG. 5 is a circuit diagram illustrating another embodiment of any one memory block BLKb among the memory blocks BLK1 to BLKz of FIG. 3.

FIG. 5 is a circuit diagram illustrating another embodiment of any one memory block BLKb among the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLK1'.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to that of the memory block BLKa of FIG. 4 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

In addition, in order to reduce the electric field between the source select transistor SST and the memory cells MC1 to MCn, at least one of the first to n-th memory cells MC1 to MCn may be used as the dummy memory cell.

Figure 6:
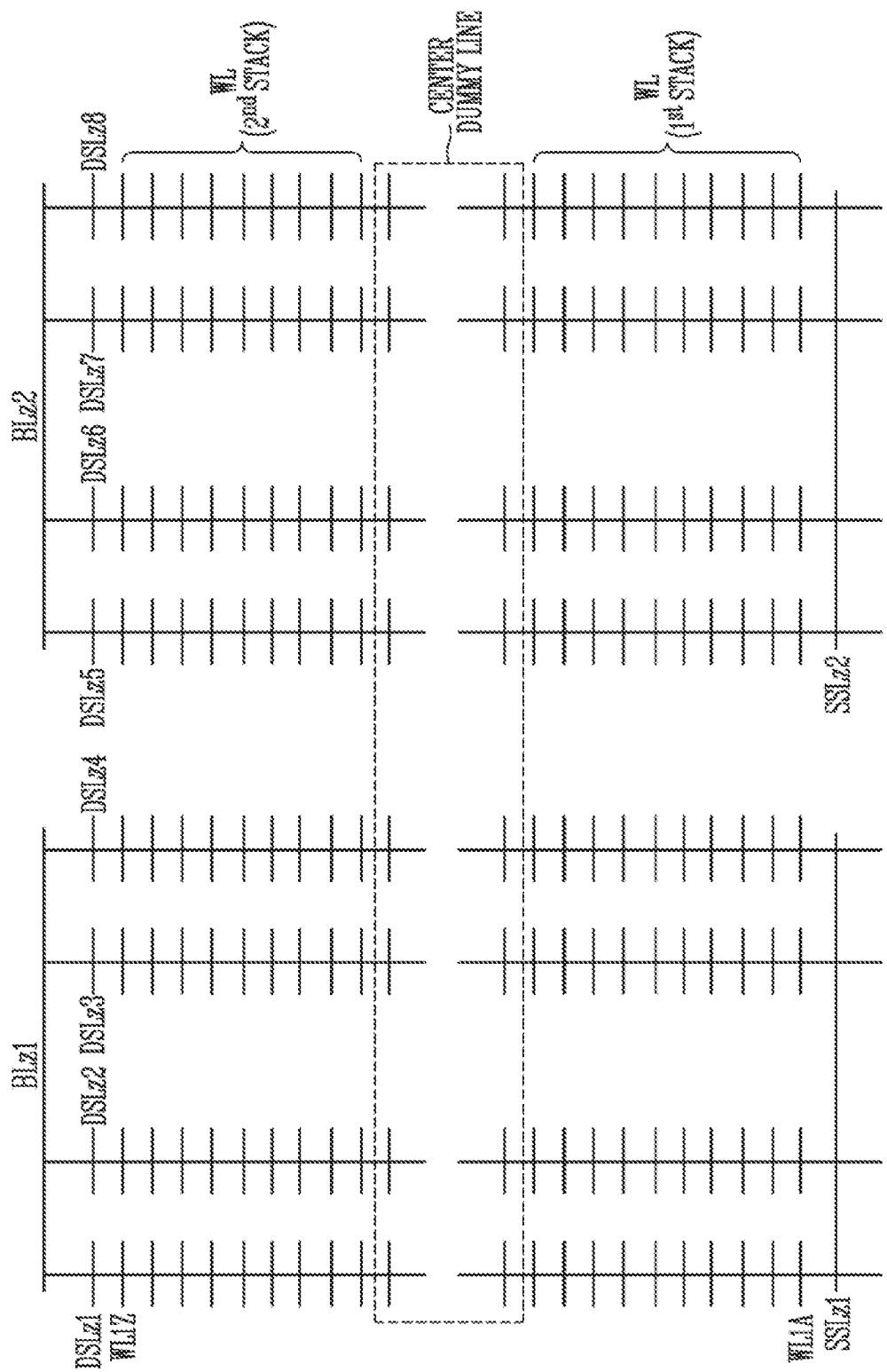
FIG. 6 illustrates memory cells programmed in a sense string.

FIG. 6 illustrates memory cells programmed in a sense string.

Referring to FIGS. 2 and 6, FIG. 6 shows lines connected to any one of the plurality of memory blocks BLK1 to BLKz of FIG. 2.

Specifically, a first cell string of eight cell strings may be a cell string connecting a z1-th drain select line DSLz1 and a z1-th source select line SSLz1, a second cell string may be a cell string connecting a z2-th drain select line DSLz2 and the z1-th source select line SSLz1, a third cell string may be a cell string connecting a z3-th drain select line DSLz3 and the z1-th source select line SSLz1, and a fourth cell string may be a cell string connecting a z4-th drain select line DSLz4 and the z1-th source select line SSLz1.

In addition, a fifth cell string may be a cell string connecting a z5-th drain select line DSLz5 and a z2-th source select line SSLz2, a sixth cell string may be a cell string connecting a z6-th drain select line DSLz6 and the z2-th source select line SSLz2, a seventh cell string may be a cell string connecting a z7-th drain select line DSLz7 and the z2-th source select line SSLz2, and an eighth cell string may be a cell string connecting a z8-th drain select line DSLz8 and the z2-th source select line SSLz2.

The z1-th to z4-th drain select lines DSLz1 to DSLz4 may be connected to a z1-th bit line BLz1, and the z5-th to z8-th drain select lines DSLz5 to DSLz8 may be connected to a z2-th bit line BLz2.

In an embodiment, each of the first to eighth cell strings may be connected to word lines included in two stacks.

For example, the first cell string may be connected to a first stack $1^{st}$ STACK including word lines connected between the z1-th source select line SSLz1 and a center dummy line CENTER DUMMY LINE and a second stack $2^{nd}$ STACK including word lines connected between the z1-th drain select line DSLz1 and the center dummy line CENTER DUMMY LINE.

The second cell string may be connected to the first stack $1^{st}$ STACK including the word lines connected between the z1-th source select line SSLz1 and the center dummy line CENTER DUMMY LINE and a second stack $2^{nd}$ STACK including word lines connected between the z2-th drain select line DSLz2 and the center dummy line CENTER DUMMY LINE.

The third cell string may be connected to the first stack $1^{st}$ STACK including the word lines connected between the z1-th source select line SSLz1 and the center dummy line CENTER DUMMY LINE and a second stack $2^{nd}$ STACK including word lines connected between the z3-th drain select line DSLz3 and the center dummy line CENTER DUMMY LINE.

The fourth cell string may be connected to the first stack $1^{st}$ STACK including the word lines connected between the z1-th source select line SSLz1 and the center dummy line CENTER DUMMY LINE and a second stack $2^{nd}$ STACK including word lines connected between the z4-th drain select line DSLz4 and the center dummy line CENTER DUMMY LINE.

For example, the fifth cell string may be connected to a first stack $1^{st}$ STACK including word lines connected between the z2-th source select line SSLz2 and the center dummy line CENTER DUMMY LINE and a second stack $2^{nd}$ STACK including word lines connected between the z5-th drain select line DSLz5 and the center dummy line CENTER DUMMY LINE.

The sixth cell string may be connected to the first stack $1^{st}$ STACK including the word lines connected between the z2-th source select line SSLz2 and the center dummy line CENTER DUMMY LINE and a second stack $2^{nd}$ STACK including word lines connected between the z6-th drain select line DSLz6 and the center dummy line CENTER DUMMY LINE.

The seventh cell string may be connected to the first stack $1^{st}$ STACK including the word lines connected between the z2-th source select line SSLz2 and the center dummy line CENTER DUMMY LINE and a second stack $2^{nd}$ STACK including word lines connected between the z7-th drain select line DSLz7 and the center dummy line CENTER DUMMY LINE.

The eighth cell string may be connected to the first stack $1^{st}$ STACK including the word lines connected between the z2-th source select line SSLz2 and the center dummy line CENTER DUMMY LINE and a second stack $2^{nd}$ STACK including word lines connected between the z8-th drain select line DSLz8 and the center dummy line CENTER DUMMY LINE.

In an embodiment, the memory controller 200 of FIG. 1 may select any one of the first to eighth cell strings as the sense string before the program operation is performed first on the memory block. The sense string may be a string that is most affected when exposed to the high temperature or preset temperature environment.

In FIG. 6, it is assumed that the sense string is the first cell string.

When the sense string is selected, the memory controller 200 of FIG. 1 may select a 1A-th word line WL1A which is the start word line and a 1Z-th word line WL1Z which is the last word line among the word lines connected to the sense string as the monitoring word lines.

In an embodiment, the memory controller 200 of FIG. 1 may control the memory device 100 of FIG. 1 to perform the program operation on at least one of memory cells connected to the 1A-th and 1Z-th word lines WL1A and WL1Z before the program operation is performed on the memory block or when the program operation is started. At this time, the program data or the dummy data may be programmed in the at least one of the memory cells connected to the 1A-th and 1Z-th word lines WL1A and WL1Z in the SLC method. The at least one of the memory cells connected to the 1A-th and 1Z-th word lines WL1A and WL1Z may be the monitoring memory cell.

In an embodiment, after the program data or the dummy data is programmed in the monitoring memory cell, the read operation may be performed on a corresponding memory block. At this time, before the read operation is performed, the memory controller 200 of FIG. 1 may perform the read operation on the monitoring memory cell to check whether the corresponding memory block is exposed for a long time or preset time in the high temperature or preset temperature.

Figure 7:
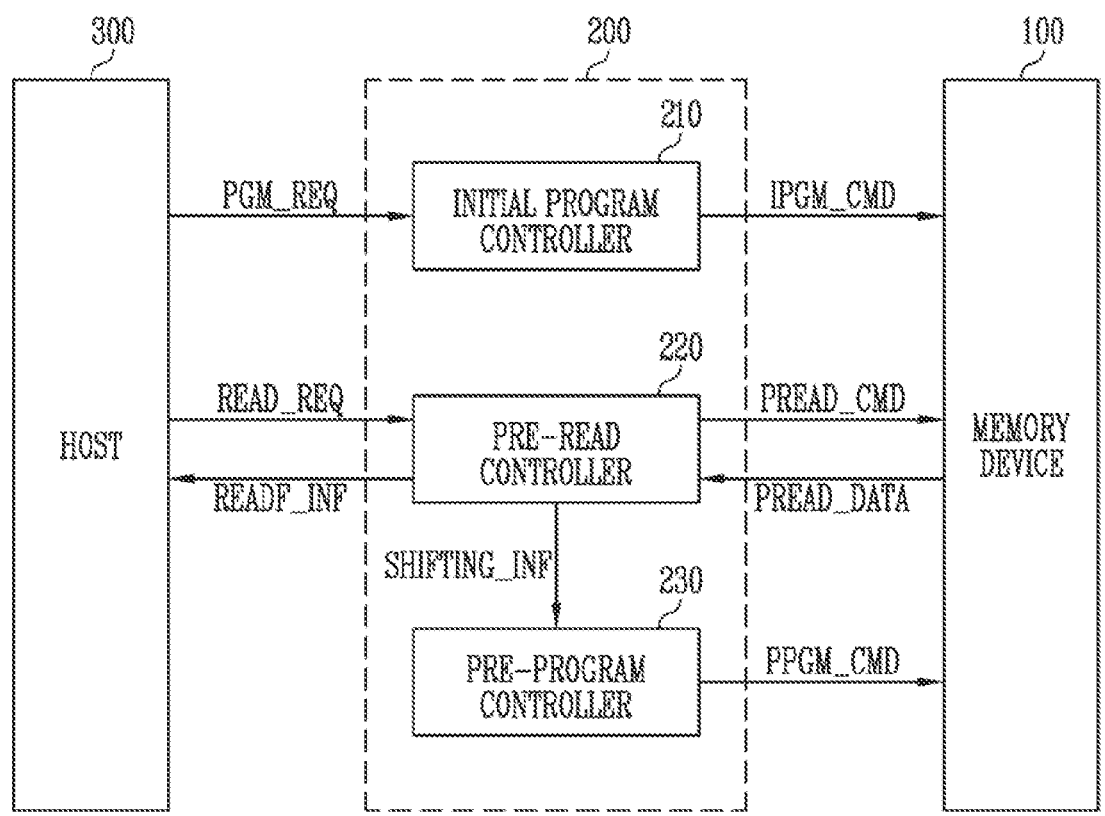
FIG. 7 illustrates a process in which an initial program operation, a pre-read operation, and a pre-program operation are performed.

FIG. 7 illustrates a process in which an initial program operation, a pre-read operation, and a pre-program operation are performed.

Referring to FIG. 7, FIG. 7 shows a process in which monitoring memory cells connected to the monitoring word line are programmed before the program operation is performed on the memory device 100, and then the pre-program operation is performed based on a result of performing the pre-read operation on the monitoring memory cells before the read operation is performed.

The memory controller 200 of FIG. 7 may include the initial program controller 210, the pre-read controller 220, and the pre-program controller 230.

In an embodiment, the memory controller 200 may receive a program request PGM_REQ from the host 300. At this time, the program request PGM_REQ may be a request instructing to program selected memory cells among the plurality of memory cells each included in the plurality of memory blocks included in the memory device 100.

In an embodiment, the memory controller 200 may first receive the program request PGM_REQ for the memory block including the selected memory cells. That is, the program operation may be first performed on any one of the plurality of memory blocks included in the memory device 100.

At this time, before the program operation is performed or when the program operation is performed, the initial program controller 210 may program at least one memory cell connected to the monitoring word lines among the word lines connected to the sense string. Here, the sense string may be the string that is most affected when exposed to a high temperature or preset temperature environment among the strings connected to the memory block. In addition, the monitoring word lines may be the start word line and the last word line as the word lines positioned at the edge of the word lines connected to the sense string, and at least one memory cell connected to the monitoring word lines may be the monitoring memory cell.

In an embodiment, the initial program controller 210 may output an initial program command IPGM_CMD to the memory device 100 to program the monitoring memory cell. The memory device 100 may program the monitoring memory cell in the SLC method in response to the initial program command IPGM_CMD through an initial program operation. At this time, the program data or the dummy data may be programmed in the monitoring memory cell. When the initial program operation corresponding to the initial program command IPGM_CMD is completed (i.e., the initial programming operation has completed), the memory device 100 may program data received from the host 300 of FIG. 1 in a corresponding memory block (i.e., through a program operation).

Thereafter, the pre-read controller 220 may receive a read request READ_REQ from the host 300 of FIG. 1. The read request READ_REQ may be a request instructing to read the selected memory cells among the plurality of memory cells each included in the plurality of memory blocks included in the memory device 100.

In an embodiment, before a read command corresponding to the read request READ_REQ received from the host 300 in FIG. 1 is output, the pre-read controller 220 may output a pre-read command PREAD_CMD. The pre-read command PREAD_CMD may be a command instructing to read the monitoring memory cell. At this time, the pre-read operation corresponding to the pre-read command PREAD_CMD may be performed with read voltages greater than the normal read voltage that distinguishes between the erase state and the program state.

In an embodiment, the memory device 100 may read the monitoring memory cell in response to the pre-read command PREAD_CMD and output the read pre-read data PREAD_DATA to the pre-read controller 220. The pre-read controller 220 may determine shifting of the threshold voltage distribution of the memory cells based on the pre-read data PREAD_DATA, generate the shifting information SHIFTING_INF based on a determination result, and output the shifting information SHIFTING_INF to the pre-program controller 230.

In an embodiment, when the shifting degree of the threshold voltage distribution is within a preset range, the pre-read controller 220 may generate the shifting information SHIFTING_INF and output the shifting information SHIFTING_INF to the pre-program controller 230. The pre-program controller 230 may output a pre-program command PPGM_CMD to the memory device 100 so that the pre-program operation is performed on the memory device 100 based on the received shifting information SHIFTING_INF. Here, the pre-program operation may be the operation of applying the program voltage to the word lines connected to the memory block on which the read operation is to be performed. The word "preset" as used herein with respect to a parameter, such as a preset range, preset temperature, or preset time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

However, when the shifting degree of the threshold voltage distribution is not within the preset range, the pre-read controller 220 might not generate the shifting information SHIFTING_INF.

Specifically, when the shifting degree of the threshold voltage distribution is small and does not reach the preset range, the pre-read controller 220 might not generate the shifting information SHIFTING_INF, and the read operation corresponding to the request READ_REQ received from the host 300 of FIG. 1 may be performed immediately.

Conversely, when the shifting degree of the threshold voltage distribution is large and exceeds the preset range, the pre-read controller 220 might not generate the shifting information SHIFTING_INF and may process the read operation as the fail before the read operation is performed. For example, the pre-read controller 220 may output read fail information READF_INF to the host 300 in response to the read request READ_REQ received from the host 300.

As described above, reliability of read data may be secured by processing the read operation as the fail or controlling the read operation to be performed after the pre-program operation according to the shifting degree of the monitoring memory cell.

Figure 8:
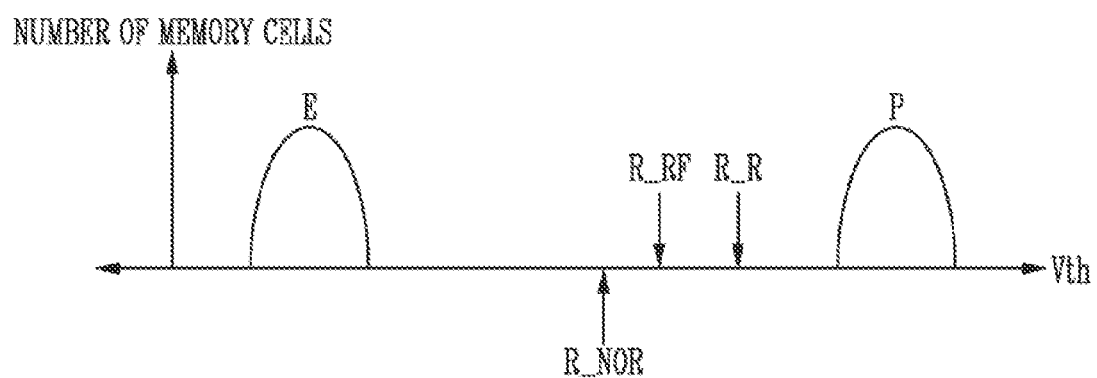
FIG. 8 illustrates pre-read voltages used in a pre-read operation.

FIG. 8 illustrates pre-read voltages used in a pre-read operation.

Referring to FIG. 8, FIG. 8 shows the threshold voltage distribution when the memory cells included in the memory device 100 of FIG. 1 are programmed in the SLC method.

When the memory cells are programmed in the SLC method, each of the memory cells may have any one of an erase state E or a program state P.

In FIG. 8, a horizontal axis represents a threshold voltage level Vth of the memory cells, and a vertical axis represents the number of memory cells.

In an embodiment, a voltage that distinguishes between the erase state E and the program state P may be a normal read voltage R_NOR.

However, the pre-read voltages for determining the shifting degree of the monitoring memory cells programmed in the SLC method may be voltages of a level greater than that of the normal read voltage R_NOR. Here, the monitoring memory cells may be the memory cells on which the program operation corresponding to the initial program command IPGM_CMD is performed, as at least one or more memory cells each connected to the start word line and the last word line positioned at the edge of the word lines connected to the sense string of FIG. 7.

In an embodiment, before the read operation corresponding to the read request received from the host 300 of FIG. 1 is performed, the pre-read operation on the monitoring memory cells may be performed. The pre-read operation may be performed with the pre-read voltages of a level higher than that of the normal read voltage R_NOR. The pre-read voltages may include a reflow voltage R_R and a reflow fail voltage R_RF. A level of the reflow voltage R_R may be greater than a level of the reflow fail voltage R_RF.

In the present drawing, the pre-read voltages includes the reflow voltage R_R and the reflow fail voltage R_RF, that is, two read voltages. However, in another embodiment the pre-read voltages may include a greater or lesser number of voltages.

In an embodiment, the pre-read operation may be first performed with the reflow voltage R_R among the pre-read voltages. As a result of performing the pre-read operation with the reflow voltage R_R, when the number of turned on memory cells is less than a preset first reference value (a natural number greater than 1), the pre-program operation may be omitted, and the read operation corresponding to the read request received from the host 300 of FIG. 1 may be performed immediately. Here, the pre-program operation may be the operation of applying the program voltage to the word lines connected to the memory block in which the read operation is to be performed.

However, when the number of turned on memory cells is greater than or equal to the first reference value and less than a second reference value, that is, within the preset range, after the pre-program operation is performed, the read operation corresponding to the read request received from the host 300 of FIG. 1 may be performed. Here, the second reference value may be a value greater than the first reference value and may be a natural number.

In an embodiment, when the number of turned on memory cells is greater than or equal to the preset second reference value, before the read operation corresponding to the read request received from the host 300 of FIG. 1 is performed, the read operation may be processed as the fail, or the pre-read operation may be performed again with the reflow fail voltage R_RF among the pre-read voltages.

When the pre-read operation is performed with the reflow fail voltage R_RF, when the number of turned on memory cells is less than a preset third reference value (a natural number greater than 1), after the pre-program operation is performed, the read operation corresponding to the read request received from the host 300 of FIG. 1 may be performed. However, when the number of turned on memory cells is greater than or equal to the preset third reference value, the read operation may be processed as the fail before the read operation corresponding to the read request received from the host 300 of FIG. 1 is performed.

Figure 9:
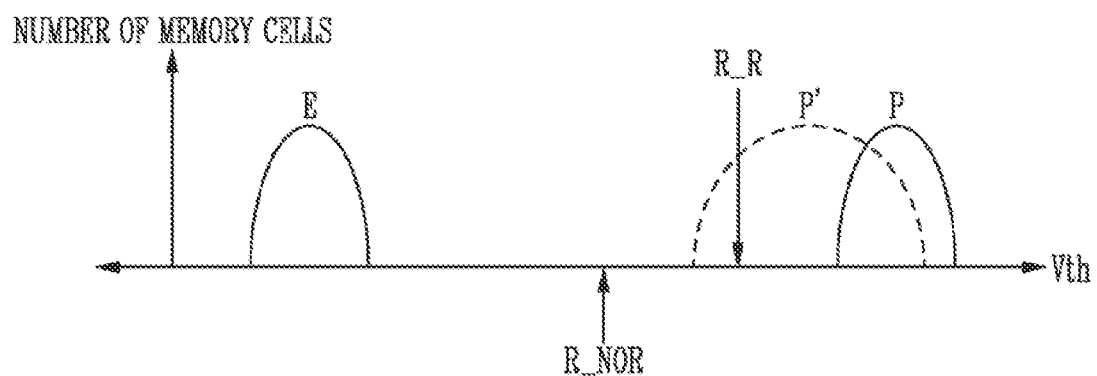
FIG. 9 illustrates an embodiment of threshold voltage distribution shifting of monitoring memory cells.

FIG. 9 illustrates an embodiment of threshold voltage distribution shifting of monitoring memory cells.

Referring to FIGS. 8 and 9, FIG. 9 shows the threshold voltage distribution P' of the monitoring memory cells changed as the memory device 100 of FIG. 1 is exposed for a long time or preset time in the high temperature or preset temperature after the monitoring memory cells are programmed in the SLC method in FIG. 8.

In FIG. 9, a horizontal axis represents the threshold voltage level Vth of the memory cells, and a vertical axis represents the number of memory cells.

In an embodiment, before the read operation corresponding to the read request received from the host 300 of FIG. 1 is performed, the pre-read operation on the monitoring memory cells may be performed. The pre-read operation may be performed with the reflow fail voltage R_RF and the reflow voltage R_R of the level greater than that of the normal read voltage R_NOR.

In FIG. 9, it is assumed that the pre-read operation is performed only with the reflow voltage R_R.

In an embodiment, as a result of performing the pre-read operation with the reflow voltage R_R before the read operation is performed, some memory cells among the monitoring memory cells may be turned on due to the shifting of the threshold voltage distribution of the monitoring memory cells.

At this time, when the number of turned on memory cells is less than the preset first reference value (a natural number greater than 1), the pre-program operation may be omitted, and the read operation corresponding to the read request received from the host 300 of FIG. 1 may be performed immediately. Here, the pre-program operation may be the operation of applying the program voltage to the word lines connected to the memory block on which the read operation is to be performed.

However, when the number of turned on memory cells is greater than or equal to the first reference value and less than the second reference value, that is, within the preset range, the read operation corresponding to the read request received from the host 300 of FIG. 1 may be performed after the pre-program operation is performed. Here, the second reference value may be a natural number as a value greater than the first reference value.

In an embodiment, when the number of turned on memory cells is greater than or equal to the preset second reference value, the read operation may be processed as the fail before the read operation corresponding to the read request received from the host 300 of FIG. 1 is performed.

As a result, when the threshold voltage distribution of the monitoring memory cells is shifted, the read operation may be performed after the pre-program operation or the read operation is processed as the fail before the read operation is performed based on the result of the pre-read operation. Thus, the reliability of the read data may be secured.

Figure 10B:
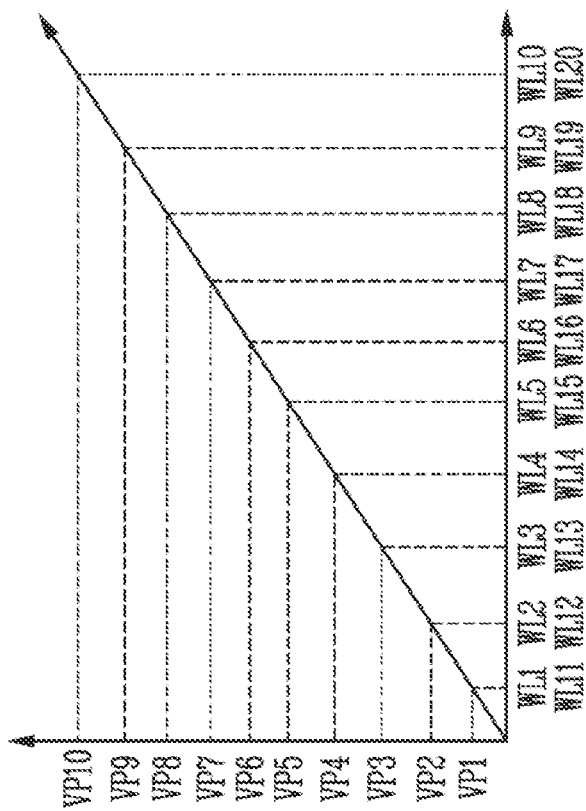
FIGS. 10A and 10B illustrate a pre-program voltage applied to a word line during a pre-program operation.
Figure 10A:
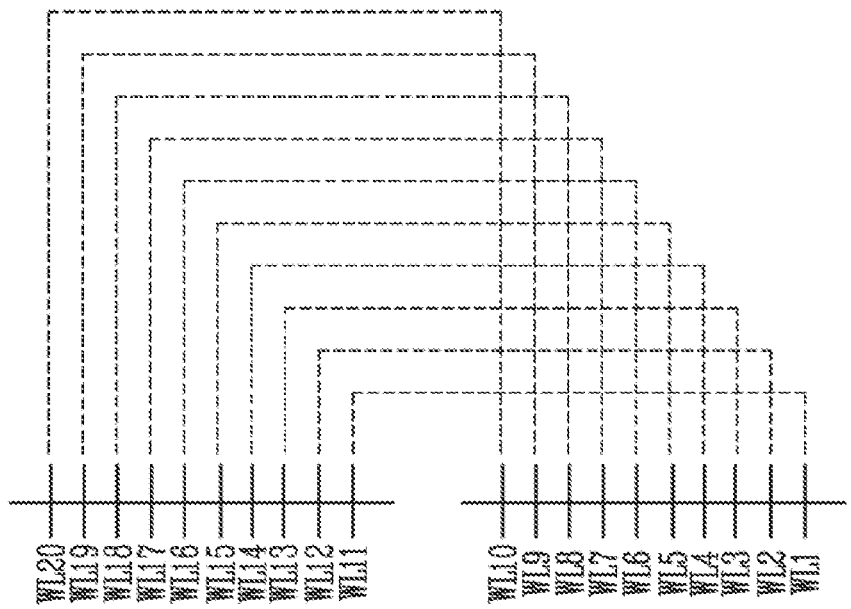

FIGS. 10A and 10B illustrate a pre-program voltage applied to a word line during a pre-program operation.

Referring to FIGS. 6, 10A and 10B, FIG. 10A shows the plurality of word lines connected to the sense string of FIG. 6, and FIG. 10B shows a level of the preprogram voltage applied to the plurality of word lines connected to the sense string during the preprogram operation.

In an embodiment, before the program operation is first performed on the memory block, the string of the edge among the plurality of strings connected to the corresponding memory block may be selected as the sense string. When the sense string is selected, the start word line and the last word line among the plurality of word lines connected to the sense string may be selected as the monitoring word lines.

Thereafter, before the program operation is first performed on the memory block, at least one or more of the memory cells each connected to the monitoring word lines may be programmed in the SLC method. The memory cells programmed in the SLC method may be monitoring memory cells.

After the monitoring memory cells are programmed, the memory controller 200 of FIG. 1 may receive the read request for the memory block including the monitoring memory cells from the host 300 of FIG. 1.

In an embodiment, the pre-read operation may be performed before the read operation corresponding to the read request received from the host 300 of FIG. 1 is performed. As a result of performing the pre-read operation, when the number of turned on memory cells is within the preset range, the read operation corresponding to the read request may be performed after the pre-program operation is performed.

The pre-program voltages used in the pre-program operation may be set for each group according to the position of the word line in the sense string.

Referring to FIG. 10A, among the word lines connected to the sense string, first and eleventh word lines WL1 and WL11 may be set as a first group, second and twelfth word lines WL2 and WL12 may be set as a second group, third and thirteenth word lines WL3 and WL13 may be set as a third group, fourth and fourteenth word lines WL4 and WL14 may be set as a fourth group, fifth and fifteenth word lines WL5 and WL15 may be set as a fifth group, sixth and sixteenth word lines WL6 and WL16 may be set as a sixth group, seventh and seventeenth word lines WL7 and WL17 may be set as a seventh group, eighth and eighteenth word lines WL8 and WL18 may be set as an eighth group, ninth and nineteenth word lines WL9 and WL19 may be set as a ninth group, and tenth and twentieth word lines WL10 and WL20 may be set as a tenth group.

When the plurality of word lines connected to the sense string are divided into groups, the pre-program voltage may be applied for each group during the pre-program operation.

Referring to FIG. 10B, during the pre-program operation, a first pre-program voltage VP1 may be applied to the word lines WL1 and WL11 of the first group, a second pre-program voltage VP2 may be applied to the word lines WL2 and WL12 of the second group, a third pre-program voltage VP3 may be applied to the word lines WL3 and WL13 of the third group, a fourth pre-program voltage VP4 may be applied to the word lines WL4 and WL14 of the fourth group, a fifth pre-program voltage VP5 may be applied to the word lines WL5 and WL15 of the fifth group, a sixth pre-program voltage VP6 may be applied to the word lines WL6 and WL16 of the sixth group, a seventh pre-program voltage VP7 may be applied to the word lines WL7 and WL17 of the seventh group, an eighth pre-program voltage VP8 may be applied to the word lines WL8 and WL18 of the eighth group, a ninth pre-program voltage VP9 may be applied to the word lines WL9 and WL19 of the ninth group, and a tenth pre-program voltage VP10 may be applied to the word lines WL10 and WL20 of the tenth group.

At this time, the level of the pre-program voltage may increase from the lower portion to the upper portion of the sense string. Therefore, the level of the pre-program voltage may increase sequentially from the first pre-program voltage VP1 to the tenth pre-program voltage VP10. The preprogram voltage may increase from a group including a word line most adjacent to a source select line among a plurality of groups to a group including a word line most adjacent to a drain select line among the plurality of groups.

Figure 11:
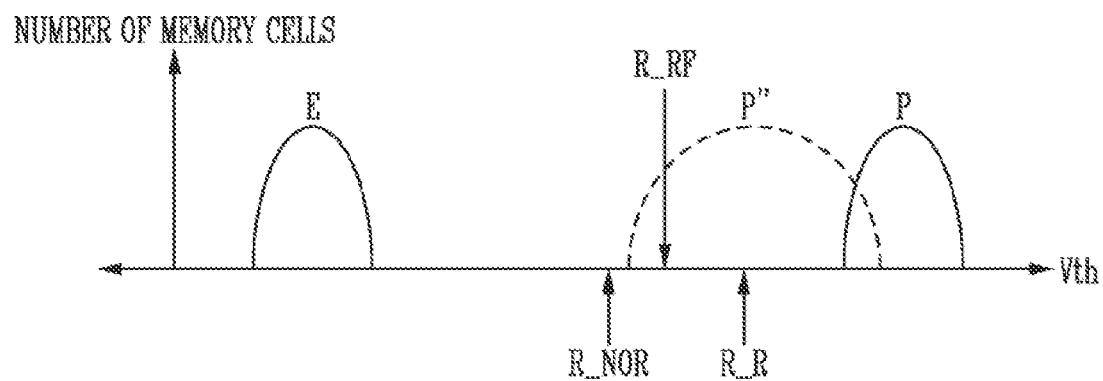
FIG. 11 illustrates an embodiment of threshold voltage distribution shifting of monitoring memory cells.

FIG. 11 illustrates an embodiment of threshold voltage distribution shifting of monitoring memory cells.

Referring to FIGS. 8 and 11, FIG. 11 shows the threshold voltage distribution P''' of the monitoring memory cells changed as the memory device 100 of FIG. 1 is exposed for a long time or preset time in the high temperature or preset temperature after the monitoring memory cells are programmed in the SLC method in FIG. 8.

In FIG. 11, a horizontal axis represents the threshold voltage level Vth of the memory cells, and a vertical axis represents the number of memory cells.

In an embodiment, before the read operation corresponding to the read request received from the host 300 of FIG. 1 is performed, the pre-read operation on the monitoring memory cells may be performed. The pre-read operation may be performed with the reflow fail voltage R_RF and the reflow voltage R_R of the level greater than that of the normal read voltage R_NOR.

Differently from FIG. 9, in FIG. 11, it is assumed that the pre-read operation is performed with the reflow voltage R_R and the reflow fail voltage R_RF.

In an embodiment, the pre-read operation may be performed first with the reflow voltage R_R of the reflow voltage R_R and the reflow fail voltage R_RF before the read operation is performed. As a result of performing the pre-read operation with the reflow voltage R_R before the read operation is performed, some memory cells among the monitoring memory cells may be turned on due to the shifting of the threshold voltage distribution of the monitoring memory cells.

At this time, when the number of turned on memory cells is less than the preset first reference value (a natural number greater than 1), the pre-program operation may be omitted, and the read operation corresponding to the read request received from the host 300 of FIG. 1 may be performed immediately. Here, the pre-program operation may be the operation of applying the program voltage to the word lines connected to the memory block on which the read operation is to be performed.

However, when the number of turned on memory cells is greater than or equal to the first reference value and less than the second reference value, that is, within the preset range, the read operation corresponding to the read request received from the host 300 of FIG. 1 may be performed after the pre-program operation is performed. Here, the second reference value may be a natural number as a value greater than the first reference value.

In an embodiment, when the number of turned on memory cells is greater than or equal to the preset second reference value, the pre-read operation may be performed again with the reflow fail voltage R_RF of the reflow voltage R_R and the reflow fail voltage R_RF. As a result of performing the pre-read operation again, some memory cells among the monitoring memory cells may be turned on.

In a case where the pre-read operation is performed with the reflow fail voltage R_RF, when the number of turned on memory cells is less than the preset third reference value (a natural number greater than 1), the read operation corresponding to the read request received from the host 300 of FIG. 1 may be performed after the pre-program operation is performed. However, when the number of turned on memory cells is greater than or equal to the preset third reference value, the read operation may be processed as the fail before the read operation corresponding to the read request received from the host 300 of FIG. 1 is performed.

As a result, when the threshold voltage distribution of the monitoring memory cells is shifted, the read operation may be performed after the pre-program operation or the read operation is processed as the fail before the read operation is performed based on the result of the pre-read operation. Thus, the reliability of the read data may be secured.

Figure 12:
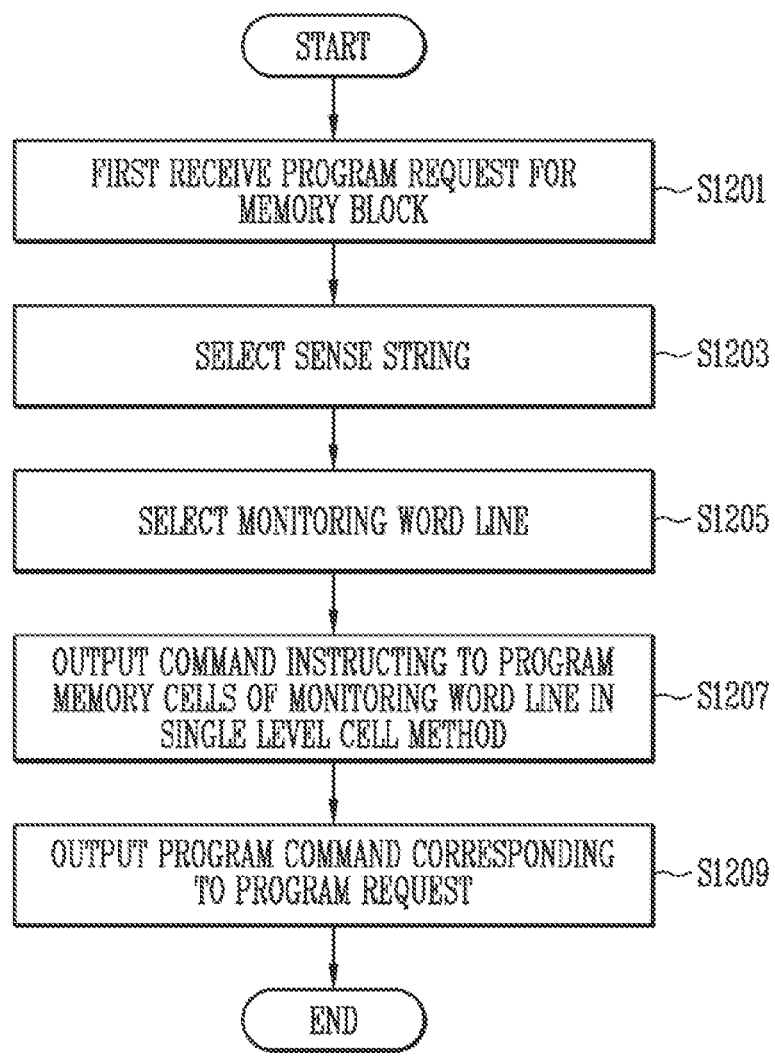
FIG. 12 is a diagram illustrating an operation of a memory controller according to an embodiment of the present disclosure.

FIG. 12 is a diagram illustrating an operation of a memory controller according to an embodiment of the present disclosure.

Referring to FIG. 12, in step S1201, the memory controller may first receive the program request for any one of the plurality of memory blocks included in the memory device from the host. The program request received from the host may be the request instructing to program the memory cells selected from among the plurality of memory cells included in the memory block, as a program request first received for a corresponding memory block.

In step S1203, before outputting the program command corresponding to the program request, the memory controller may select the sense string from among the plurality of strings connected to the memory block on which the program operation corresponding to the program command is to be performed. The sense string may be the string that is most affected when exposed in the high temperature or preset temperature environment.

After the sense string is selected, in step S1205, the memory controller may select the monitoring word line from among the plurality of word lines connected to the sense string. The monitoring word line may be the start word line and the last word line positioned at the edge among the plurality of word lines connected to the sense string.

After the monitoring word line is selected, in step S1207, the memory controller may output the program command instructing to perform an initial programming operation of initially programming the memory cells connected to the monitoring word line in the SLC method before performing the program operation corresponding to the program request received from the host. At this time, at least one or more of the memory cells connected to the monitoring word line may be programmed in the SLC method, and the program data or the dummy data may be programmed.

In step S1209, the memory controller may output the program command corresponding to the program request received from the host. When the program command is output, the memory device may perform the program operation corresponding to the program command.

Figure 13:
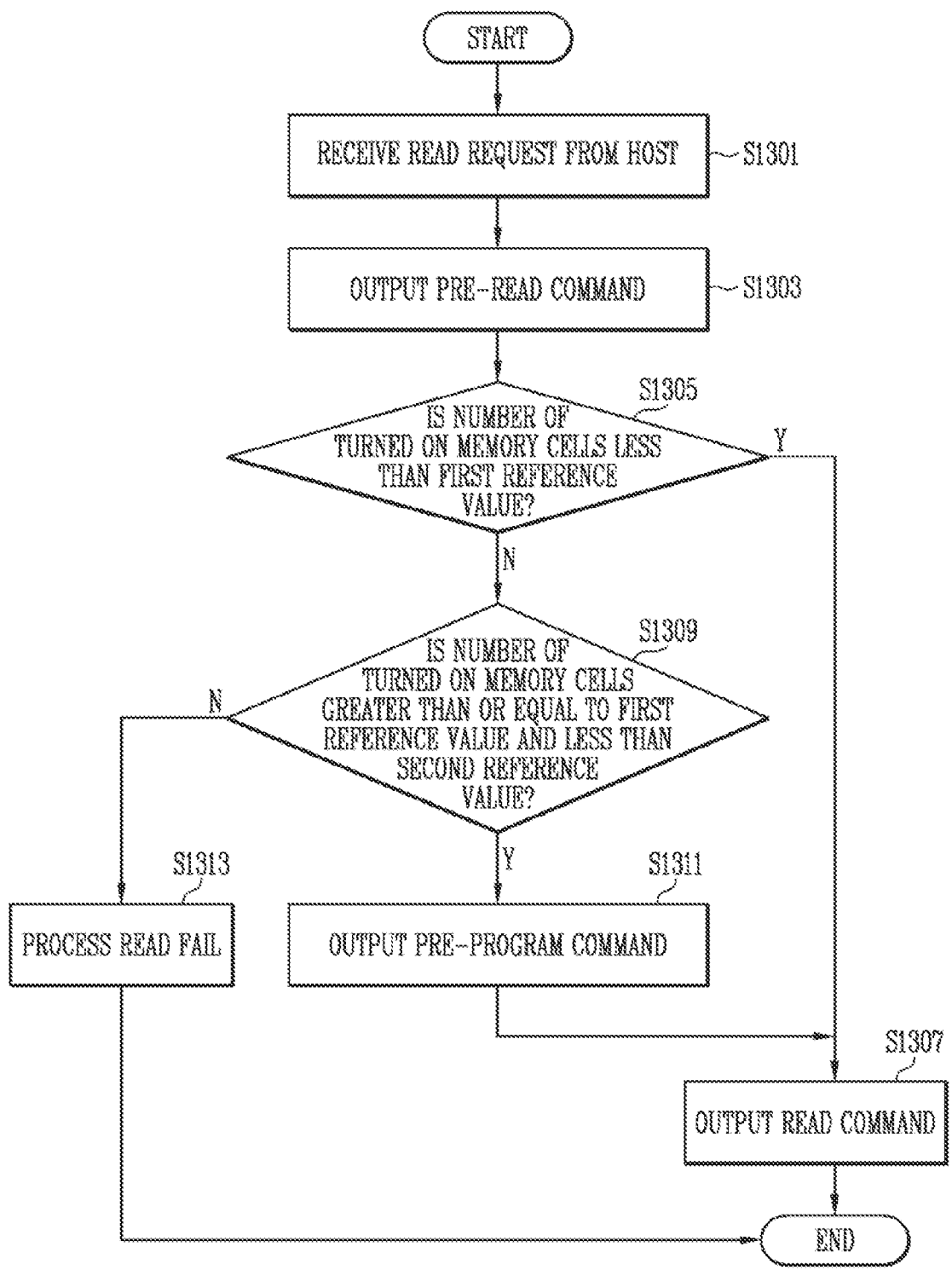
FIG. 13 is a diagram illustrating an operation of a memory controller according to an embodiment of the present disclosure.

FIG. 13 is a diagram illustrating an operation of a memory controller according to an embodiment of the present disclosure.

Referring to FIG. 13, in step S1301, the memory controller may receive the read request from the host. The read request may be the request instructing to read the memory cells selected from among the plurality of memory cells included in the memory device.

When the read request is received from the host, before the read command corresponding to the read request is output to the memory device, in step S1303, the memory controller may output the pre-read command to the memory device. The pre-read command may be a command instructing to read the monitoring memory cells to determine the shifting degree of the monitoring memory cells.

In an embodiment, during the pre-read operation corresponding to the pre-read command, the read operation may be performed with a voltage of a level greater than that of the normal read voltage that distinguishes between the erase state and the program state. When the pre-read command is output to the memory device, the memory device may read the monitoring memory cells and output the pre-read data which is a read result to the memory controller.

In step S1305, the memory controller may determine whether the number of turned on memory cells is less than the first reference value based on the pre-read data.

When the number of turned on memory cells is less than the first reference value (Y), it is determined that the memory device is not exposed for a long time or preset time in the high temperature or preset temperature environment, the memory device may omit an output of the pre-program command, the read command may be output to the memory device immediately (step S1307).

However, when the number of turned on memory cells is greater than or equal to the first reference value (N), the method proceeds to step S1309, and the memory controller may determine whether the number of turned on memory cells is greater than or equal to the first reference value and less than the second reference value.

When the number of turned on memory cells is greater than or equal to the first reference value and less than the second reference value (Y), the method may proceed to step S1311, and thus the memory controller may output the pre-program command to the memory device so that the pre-program operation is performed on the memory device. Here, the pre-program operation may be the operation of applying the program voltage to the word lines connected to the memory block on which the read operation is to be performed. When the pre-program operation corresponding to the pre-program command is performed, the memory controller may output the read command to the memory device.

However, when the number of turned on memory cells is greater than or equal to the second reference value (N), the method may proceed to step S1313, and the memory controller may determine that the memory device is exposed for a long time or preset time in the high temperature or preset temperature environment, and may process the read operation as the fail before the read operation is performed.

Figure 14:
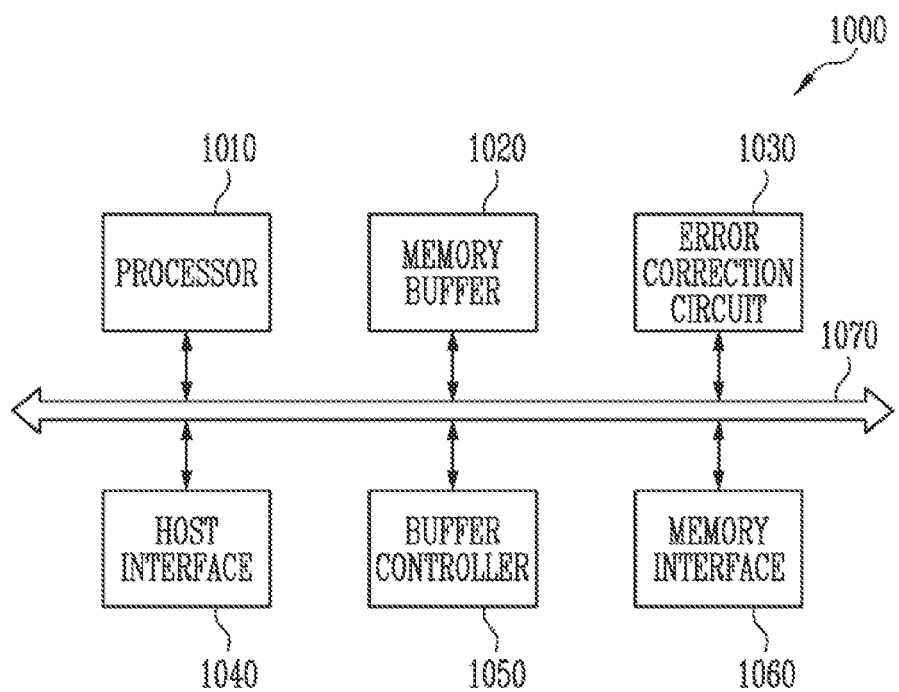
FIG. 14 is a diagram illustrating another embodiment of a memory controller of FIG. 1.

FIG. 14 is a diagram illustrating another embodiment of the memory controller of FIG. 1.

The memory controller 1000 is connected to a host and the memory device. The memory controller 1000 is configured to access the memory device in response to the request from the host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 14, the memory controller 1000 may include a processor 1010, a memory buffer 1020, an error correction circuit (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. An address mapping method of the flash translation layer include a plurality of mapping methods according to a mapping unit. A representative address mapping method includes a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored, and is programmed in the memory cell array.

The processor 1010 may perform the randomization and the de-randomization by driving software or firmware.

The memory buffer 1020 may be used as an operation memory, a cache memory, or a buffer memory of the processor 10. The memory buffer 1020 may store codes and commands executed by the processor 1010. The memory buffer 1020 may store data processed by the processor 1010. The memory buffer may include a static RAM (SRAM) or a dynamic RAM (DRAM).

The error correction circuit 1030 may perform error correction. The error correction circuit 1030 may perform error correction encoding (ECC encoding) based on data to be written to the memory device through memory interface 1060. The error correction encoded data may be transferred to the memory device through the memory interface 1060. The error correction circuit 1030 may perform error correction decoding (ECC decoding) on the data received from the memory device through the memory interface 1060. For example, the error correction circuit 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 using codes. The processor 1010 may load the codes from a nonvolatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and might not interfere with each other or affect each other. The data bus may be connected to the host interface 1040, the buffer controller 50, the error correction circuit 1030, and the memory interface 1060. The control bus may be connected to the host interface 1040, the processor 1010, the buffer controller 1050, the memory buffer 1020, and the memory interface 1060.

In an embodiment, the processor 1010 may control the memory device 100 of FIG. 1 to select the sense string and perform the initial program operation on the selected sense string before the program operation is performed first on each of the plurality of memory blocks included in the memory device 100 of FIG. 1. The sense string may be the string that is most affected when exposed to the high temperature or preset temperature environment among the strings connected to the memory block.

Specifically, the sense string may be selected from among the strings connected to the memory block on which the program operation is performed first. When the sense string is selected, the edge word lines among the plurality of word lines connected to the sense string may be selected as the monitoring word lines.

When the monitoring word lines are selected, the initial program operation of programming at least one or more monitoring memory cells among the memory cells each connected to the monitoring word lines in the SLC method may be performed. After the initial program operation is performed, the program operation may be performed first on the corresponding memory block.

Thereafter, the read request for the selected memory cells in the corresponding memory block may be received from the host 300 of FIG. 1. When the read request is received, the processor 1010 may output the pre-read command to perform the pre-read operation on the memory device 100 of FIG. 1 before outputting the read command corresponding to the read request. The pre-read operation may be an operation of reading the monitoring memory cells with at least one voltage higher than the normal read voltage level.

As a result of performing the pre-read operation, when the number of turned on memory cells is within the preset range, the processor 1010 may control the memory device 100 of FIG. 1 to perform the read operation after the pre-program operation on the corresponding memory block. The pre-program operation may be the operation of applying the pre-program voltage to the plurality of word lines connected to the corresponding memory block. At this time, the pre-program voltage level may be set for each word line group divided according to the position of the word line in the sense string.

However, as a result of performing the pre-read operation, when the number of turned on memory cells is out of the preset range, the processor 1010 may immediately perform the read operation or may process the read operation as the fail before performing the read operation.

For example, when the number of turned on memory cells does not reach the preset range, the processor 1010 may determine that the memory device 100 of FIG. 1 is not exposed to the high temperature or preset temperature state, and control the memory device 100 of FIG. 1 to perform the read operation immediately.

However, when the number of turned on memory cells exceeds the preset range, the processor 1010 may determine that the memory device 100 of FIG. 1 is exposed for a long time or preset time in the high temperature or preset temperature state, and may process the read operation as the fail before performing the read operation.

As a result, before the program operation is performed on the memory block, the monitoring memory cells may be selected and programmed, and thereafter, it may be determined whether the memory device 100 of FIG. 1 is exposed for a long time or preset time in the high temperature or preset temperature state based on the result of reading the monitoring memory cells before the read operation is performed. The reliability of the read data may be secured by performing the read operation immediately, performing the read operation after the pre-program operation, or processing the read operation as the fail according to whether the memory device 100 of FIG. 1 is exposed for a long time or preset time in the high temperature or preset temperature.

Figure 15:
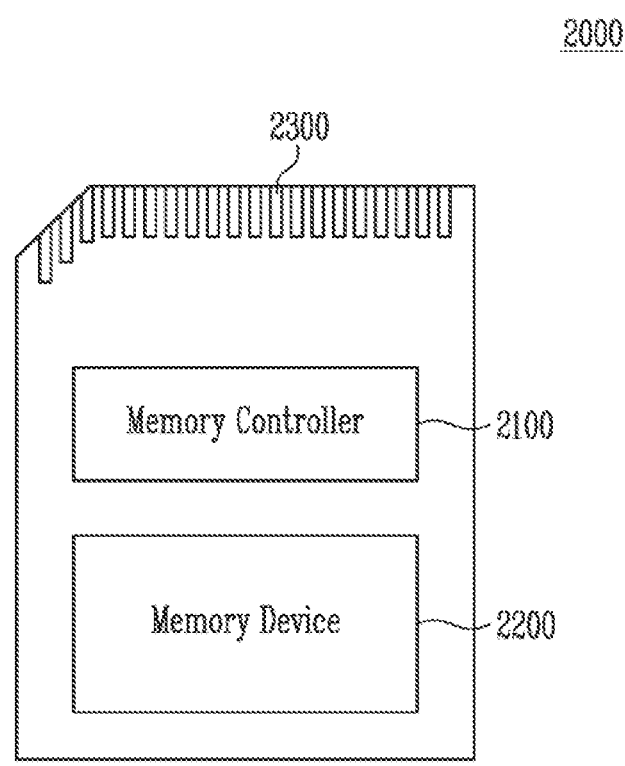
FIG. 15 is a block diagram illustrating a memory card system to which a storage device according to an embodiment of the present disclosure is applied.

FIG. 15 is a block diagram illustrating a memory card system to which the storage device according to an embodiment of the present disclosure is applied.

Referring to FIG. 15, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented equally to the memory device 100 of FIG. 1 described with reference to FIG. 1.

As an example, the memory controller 2100 may include components such as a random access memory (RAM), a processor, a host interface, a memory interface, and an error correction circuit.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. As an example, the connector 2300 may be defined by at least one of the various communication standards described above.

As an example, the memory device 2200 may be implemented as various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

In an embodiment, the memory controller 2100 may control the memory device 2200 to select the sense string and perform the initial program operation on the selected sense string before the program operation is performed first on each of the plurality of memory blocks included in the memory device 2200. The sense string may be the string that is most affected when exposed to the high temperature or preset temperature environment among the strings connected to the memory block.

Specifically, the sense string may be selected from among the strings connected to the memory block on which the program operation is performed first. When the sense string is selected, the edge word lines among the plurality of word lines connected to the sense string may be selected as the monitoring word lines.

When the monitoring word lines are selected, the initial program operation of programming at least one or more monitoring memory cells among the memory cells each connected to the monitoring word lines in the SLC method may be performed. After the initial program operation is performed, the program operation may be performed first on the corresponding memory block.

Thereafter, the read request for the selected memory cells in the corresponding memory block may be received from the host 300 of FIG. 1. When the read request is received, the memory controller 2100 may output the pre-read command to perform the pre-read operation on the memory device 2200 before outputting the read command corresponding to the read request. The pre-read operation may be the operation of reading the monitoring memory cells with at least one voltage higher than the normal read voltage level.

As a result of performing the pre-read operation, when the number of turned on memory cells is within the preset range, the memory controller 2100 may control the memory device 2200 to perform the read operation after the pre-program operation on the corresponding memory block. The pre-program operation may be the operation of applying the pre-program voltage to the plurality of word lines connected to the corresponding memory block. At this time, the pre-program voltage level may be set for each word line group divided according to the position of the word line in the sense string.

However, as a result of performing the pre-read operation, when the number of turned on memory cells is out of the preset range, the memory controller 2100 may immediately perform the read operation or may process the read operation as the fail before performing the read operation.

For example, when the number of turned on memory cells does not reach the preset range, the memory controller 2100 may determine that the memory device 2200 is not exposed to the high temperature or preset temperature state, and control the memory device 2200 to perform the read operation immediately.

However, when the number of turned on memory cells exceeds the preset range, the memory controller 2100 may determine that the memory device 2200 is exposed for a long time or preset time in the high temperature or preset temperature state, and may process the read operation as the fail before performing the read operation.

As a result, before the program operation is performed on the memory block, the monitoring memory cells may be selected and programmed, and thereafter, it may be determined whether the memory device 2200 is exposed for a long time or preset time in the high temperature or preset temperature state based on the result of reading the monitoring memory cells before the read operation is performed. The reliability of the read data may be secured by performing the read operation immediately, performing the read operation after the pre-program operation, or processing the read operation as the fail according to whether the memory device 2200 is exposed for a long time or preset time in the high temperature or preset temperature.

Figure 16:
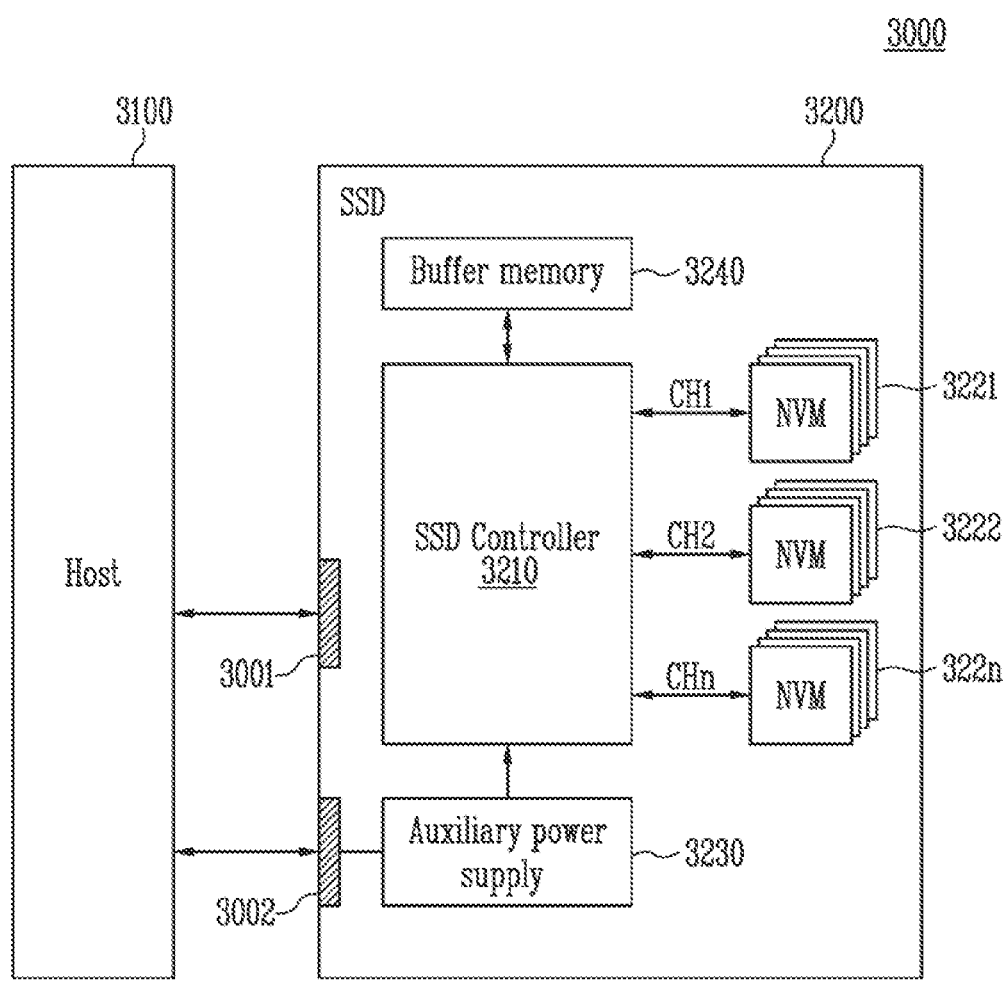
FIG. 16 is a block diagram illustrating, for example, a solid state drive (SSD) system to which a storage device according to an embodiment of the present disclosure is applied.

FIG. 16 is a block diagram illustrating, for example, a solid state drive (SSD) system to which the storage device according to an embodiment of the present disclosure is applied.

Referring to FIG. 16, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform a function of the memory controller 200 of FIG. 1 described with reference to FIG. 1.

The SSD controller 3210 may control the plurality of flash memories 3221 to 322n in response to the signal SIG received from the host 3100. As an example, the signal SIG may be signals based on an interface between the host 3100 and the SSD 3200. For example, the signal SIG may be a signal defined by at least one of interfaces such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

In an embodiment, the SSD controller 3210 may control the plurality of flash memories 3221 to 322n to select the sense string and perform the initial program operation on the selected sense string before the program operation is performed first on each of the plurality of memory blocks respectively included in the plurality of flash memories 3221 to 322n. The sense string may be the string that is most affected when exposed to the high temperature or preset temperature environment among the strings connected to the memory block.

Specifically, the sense string may be selected from among the strings connected to the memory block on which the program operation is performed first. When the sense string is selected, the edge word lines among the plurality of word lines connected to the sense string may be selected as the monitoring word lines.

When the monitoring word lines are selected, the initial program operation of programming at least one or more monitoring memory cells among the memory cells each connected to the monitoring word lines in the SLC method may be performed. After the initial program operation is performed, the program operation may be performed first on the corresponding memory block.

Thereafter, the read request for the selected memory cells in the corresponding memory block may be received from the host 3100. When the read request is received, the SSD controller 3210 may output the pre-read command to perform the pre-read operation on the plurality of flash memories 3221 to 322n before outputting the read command corresponding to the read request. The pre-read operation may be the operation of reading the monitoring memory cells with at least one voltage higher than the normal read voltage level.

As a result of performing the pre-read operation, when the number of turned on memory cells is within the preset range, the SSD controller 3210 may control the plurality of flash memories 3221 to 322n to perform the read operation after the pre-program operation on the corresponding memory block. The pre-program operation may be the operation of applying the pre-program voltage to the plurality of word lines connected to the corresponding memory block. At this time, the pre-program voltage level may be set for each word line group divided according to the position of the word line in the sense string.

However, as a result of performing the pre-read operation, when the number of turned on memory cells is out of the preset range, the SSD controller 3210 may immediately perform the read operation or may process the read operation as the fail before performing the read operation.

For example, when the number of turned on memory cells does not reach the preset range, the SSD controller 3210 may determine that the plurality of flash memories 3221 to 322n are not exposed to the high temperature or preset temperature state, and control the plurality of flash memories 3221 to 322n to perform the read operation immediately.

However, when the number of turned on memory cells exceeds the preset range, the SSD controller 3210 may determine that the plurality of flash memories 3221 to 322n are exposed for a long time or preset time in the high temperature or preset temperature state, and may process the read operation as the fail before performing the read operation.

As a result, before the program operation is performed on the memory block, the monitoring memory cells may be selected and programmed, and thereafter, it may be determined whether the plurality of flash memories 3221 to 322n are exposed for a long time or preset time in the high temperature or preset temperature state based on the result of reading the monitoring memory cells before the read operation is performed. The reliability of the read data may be secured by performing the read operation immediately, performing the read operation after the pre-program operation, or processing the read operation as the fail according to whether the plurality of flash memories 3221 to 322n are exposed for a long time or preset time in the high temperature or preset temperature.

Figure 17:
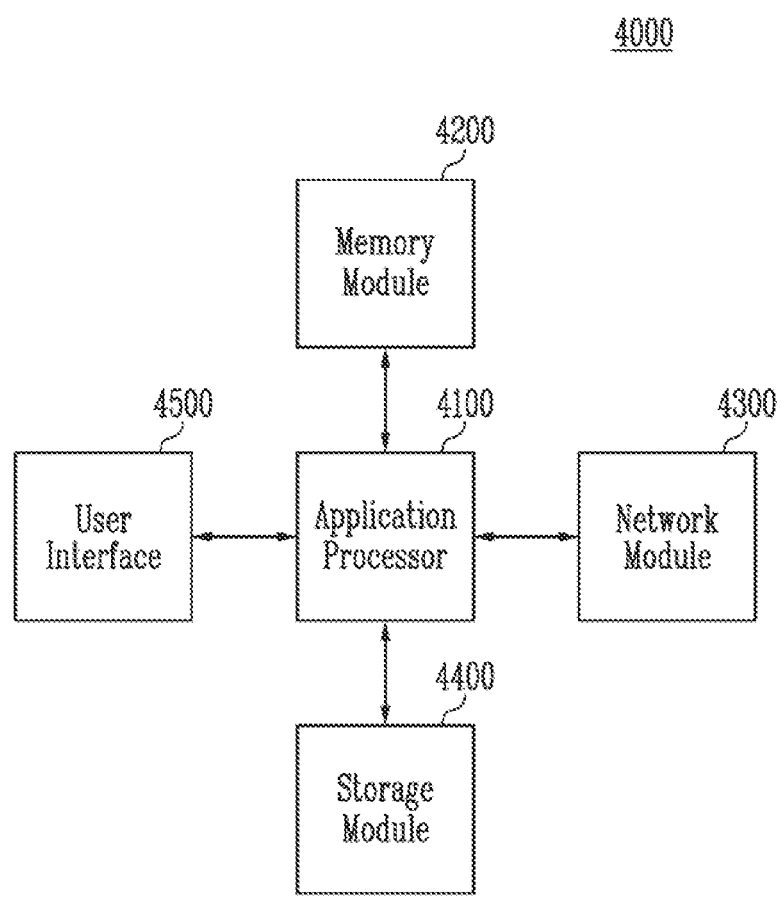
FIG. 17 is a block diagram illustrating a user system to which a storage device according to an embodiment of the present disclosure is applied.

FIG. 17 is a block diagram illustrating a user system to which the storage device according to an embodiment of the present disclosure is applied.

Referring to FIG. 17, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device described with reference to FIGS. 2 to 5. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

In an embodiment, the application processor 4100 may control the storage module 4400 to select the sense string and perform the initial program operation on the selected sense string before the program operation is performed first on each of the plurality of memory blocks included in the storage module 4400. The sense string may be the string that is most affected when exposed to the high temperature or preset temperature environment among the strings connected to the memory block.

Specifically, the sense string may be selected from among the strings connected to the memory block on which the program operation is performed first. When the sense string is selected, the edge word lines among the plurality of word lines connected to the sense string may be selected as the monitoring word lines.

When the monitoring word lines are selected, the initial program operation of programming at least one or more monitoring memory cells among the memory cells each connected to the monitoring word lines in the SLC method may be performed. After the initial program operation is performed, the program operation may be performed first on the corresponding memory block.

Thereafter, the read request for the selected memory cells in the corresponding memory block may be received from the host 300 of FIG. 1. When the read request is received, the application processor 4100 may output the pre-read command to perform the pre-read operation on the storage module 4400 before outputting the read command corresponding to the read request. The pre-read operation may be the operation of reading the monitoring memory cells with at least one voltage higher than the normal read voltage level.

As a result of performing the pre-read operation, when the number of turned on memory cells is within the preset range, the application processor 4100 may control the storage module 4400 to perform the read operation after the pre-program operation on the corresponding memory block. The pre-program operation may be the operation of applying the pre-program voltage to the plurality of word lines connected to the corresponding memory block. At this time, the pre-program voltage level may be set for each word line group divided according to the position of the word line in the sense string.

However, as a result of performing the pre-read operation, when the number of turned on memory cells is out of the preset range, the application processor 4100 may immediately perform the read operation or may process the read operation as the fail before performing the read operation.

For example, when the number of turned on memory cells does not reach the preset range, the application processor 4100 may determine that the storage module 4400 is not exposed to the high temperature or preset temperature state, and control the storage module 4400 to perform the read operation immediately.

However, when the number of turned on memory cells exceeds the preset range, the application processor 4100 may determine that the storage module 4400 is exposed for a long time or preset time in the high temperature or preset temperature state, and may process the read operation as the fail before performing the read operation.

As a result, before the program operation is performed on the memory block, the monitoring memory cells may be selected and programmed, and thereafter, it may be determined whether the storage module 4400 is exposed for a long time or preset time in the high temperature or preset temperature state based on the result of reading the monitoring memory cells before the read operation is performed. The reliability of the read data may be secured by performing the read operation immediately, performing the read operation after the pre-program operation, or processing the read operation as the fail according to whether the storage module 4400 is exposed for a long time or preset time in the high temperature or preset temperature.

What is claimed is:

1. A memory controller that controls a memory device including a memory block, the memory controller comprising:
   an initial program controller configured to control the memory device to program at least one or more monitoring memory cells from among memory cells respectively connected to monitoring word lines from among a plurality of word lines connected to the memory block;
   a pre-read controller configured to generate a shifting information of a threshold voltage distribution of the monitoring memory cells based on a result of reading the monitoring memory cells before a read operation is performed on the memory block; and
   a pre-program controller configured to control the memory device to perform the read operation after applying a pre-program voltage having a voltage level determined according to the shifting information to the plurality of word lines.

2. The memory controller of claim 1, wherein the monitoring word lines are most adjacent to a select line connected to the memory block.

3. The memory controller of claim 1, wherein the memory device further comprises:
   a voltage generator configured to generate a voltage to be applied to the memory block; and
   a row decoder configured to provide the voltage to the memory block.

4. The memory controller of claim 3, wherein the monitoring memory cells are included in a string has closest physical distance from the row decoder among a plurality of strings included in the memory block.

5. The memory controller of claim 1, wherein the monitoring memory cells is included in a string first exposed to high temperature environment among a plurality of strings included in the memory block.

6. The memory controller of claim 1, wherein the initial program controller controls the memory device to program the monitoring memory cells using a single level cell method.

7. The memory controller of claim 1, wherein the initial program controller controls the memory device to program data or dummy data to the monitoring memory cells.

8. The memory controller of claim 1, wherein the pre-read controller controls the memory device to read the monitoring memory cells at a voltage level higher than a normal read voltage level that distinguishes between an erase state and a program state, before the read operation.

9. The memory controller of claim 1, wherein the pre-read controller generates the shifting information indicating a shifting degree and outputs the shifting information to the preprogram controller, when the number of turned on memory cells is greater than or equal to a first reference value and less than a second reference value.

10. The memory controller of claim 9, wherein the pre-program controller controls the memory device to apply program voltages to each of a plurality of groups by dividing the plurality of word lines into the plurality of groups according to a position connected to a string based on the shifting information.

11. The memory controller of claim 10, wherein the program voltages increase from a group including a word line most adjacent to a source select line among the plurality of groups to a group including a word line most adjacent to a drain select line among the plurality of groups.

12. The memory controller of claim 9, wherein the pre-read controller processes the read operation as a fail before the read operation is performed, when the number of the turned on memory cells is greater than or equal to the second reference value.

13. The memory controller of claim 9, wherein the pre-read controller controls the memory device to read the monitoring memory cells at a read voltage level lower than a read voltage level used to obtain the result of reading the monitoring memory cells, when the number of the turned on memory cells is greater than or equal to the second reference value.

14. The memory controller of claim 13, wherein when the number of the turned on memory cells is less than a third reference value, the pre-read controller generates shifting information indicating the shifting degree and outputs the shifting information to the pre-program controller, and the pre-program controller controls the memory device to apply program voltages by dividing the plurality of word lines into a plurality of groups according to a position connected to a string based on the shifting information.

15. The memory controller of claim 14, wherein the pre-read controller processes the read operation as a fail before the read operation is performed, when the number of the turned on memory cells is greater than or equal to the third reference value.

16. A method of operating a memory controller that controls a memory device including a memory block, the method comprising:

receiving a program request corresponding to the memory block from a host;

programming at least one or more monitoring memory cells among memory cells respectively connected to monitoring word lines from among a plurality of word lines connected to the memory block before a program operation corresponding to the program request is performed;

receiving a read request corresponding to the memory block from the host;

reading the monitoring memory cells before a read operation corresponding to the read request is performed;

generating a shifting information of a threshold voltage distribution of the monitoring memory cells based on a result of reading the monitoring memory cells; and determining whether to program memory cells included in the memory block before the read operation based on the shifting information.

17. The method of claim 16, wherein the monitoring word lines are most adjacent to a select line connected to the memory block.

18. The method of claim 16, wherein in reading the monitoring memory cells, the monitoring memory cells are read at a voltage level higher than a normal read voltage level that distinguishes between an erase state and a program state.

19. The method of claim 16, wherein in determining whether to program the memory cells included in the memory block, when the number of turned on memory cells is greater than or equal to a first reference value and less than a second reference value, it is determined to apply program voltages for each of a plurality of groups by dividing the plurality of word lines into the plurality of groups according to a position connected to a string.

20. The method of claim 19, wherein in determining whether to program the memory cells included in the memory block, when the number of the turned on memory cells is greater than or equal to the second reference value, the read operation is processed as a fail before the read operation is performed.

* * * * *